(12) United States Patent
Tachibana

(10) Patent No.: US 8,022,504 B2
(45) Date of Patent: Sep. 20, 2011

(54) SEMICONDUCTOR DEVICE HAVING CAPACITOR WITH UPPER ELECTRODE WHOSE CIRCUMFERENCE IS MADE LONG AND ITS MANUFACTURE METHOD

(75) Inventor: Hirotoshi Tachibana, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 104 days.

(21) Appl. No.: 12/405,565

(22) Filed: Mar. 17, 2009

(65) Prior Publication Data
US 2009/0174984 A1   Jul. 9, 2009

Related U.S. Application Data

(63) Continuation of application No. PCT/JP2006/319122, filed on Sep. 27, 2006.

(51) Int. Cl.
H01L 29/41 (2006.01)
H01L 21/4763 (2006.01)

(52) U.S. Cl. ......... 257/532; 257/E21.011; 257/E29.343; 438/3; 438/396

(58) Field of Classification Search .................... 257/534
See application file for complete search history.

(56) References Cited

U.S. PATENT DOCUMENTS

| | | | |
|---|---|---|---|
| 7,198,960 B2 | 4/2007 | Okita | |
| 2003/0178659 A1 | 9/2003 | Kato | |
| 2005/0136555 A1 | 6/2005 | Wang | |
| 2005/0212019 A1* | 9/2005 | Kamoshida et al. | 257/295 |
| 2005/0212028 A1 | 9/2005 | Yamazaki et al. | |
| 2007/0042541 A1 | 2/2007 | Izumi | |

FOREIGN PATENT DOCUMENTS

| | | |
|---|---|---|
| JP | 2003-282832 A | 10/2003 |
| JP | 2005-183841 A | 7/2005 |
| JP | 2005-277350 A | 10/2005 |
| WO | 2004/077568 A1 | 9/2004 |
| WO | 2005/024950 A1 | 3/2005 |
| WO | 2006/011196 A1 | 2/2006 |

OTHER PUBLICATIONS

International Search Report of PCT/JP2006/319122, date of mailing Dec. 12, 2006.
Korean Office Action date Nov. 17, 2010, issued in corresponding Korean Pateant Application No. 10-2009-7006486.

* cited by examiner

*Primary Examiner* — Stephen W Smoot
(74) *Attorney, Agent, or Firm* — Westerman, Hattori, Daniels & Adrian, LLP

(57) ABSTRACT

A capacitor is formed over a semiconductor substrate. The capacitor includes a lower electrode, a capacitor dielectric film and an upper electrode in this order recited, and has an area S equal to or larger than 1000 μm$^2$ and L/S equal to or larger than 0.4 μm$^{-1}$, where S is an area of a capacitor region in which the lower and upper electrodes face each other across the dielectric film, and L is a total length of a circumference line of the capacitor region.

19 Claims, 11 Drawing Sheets

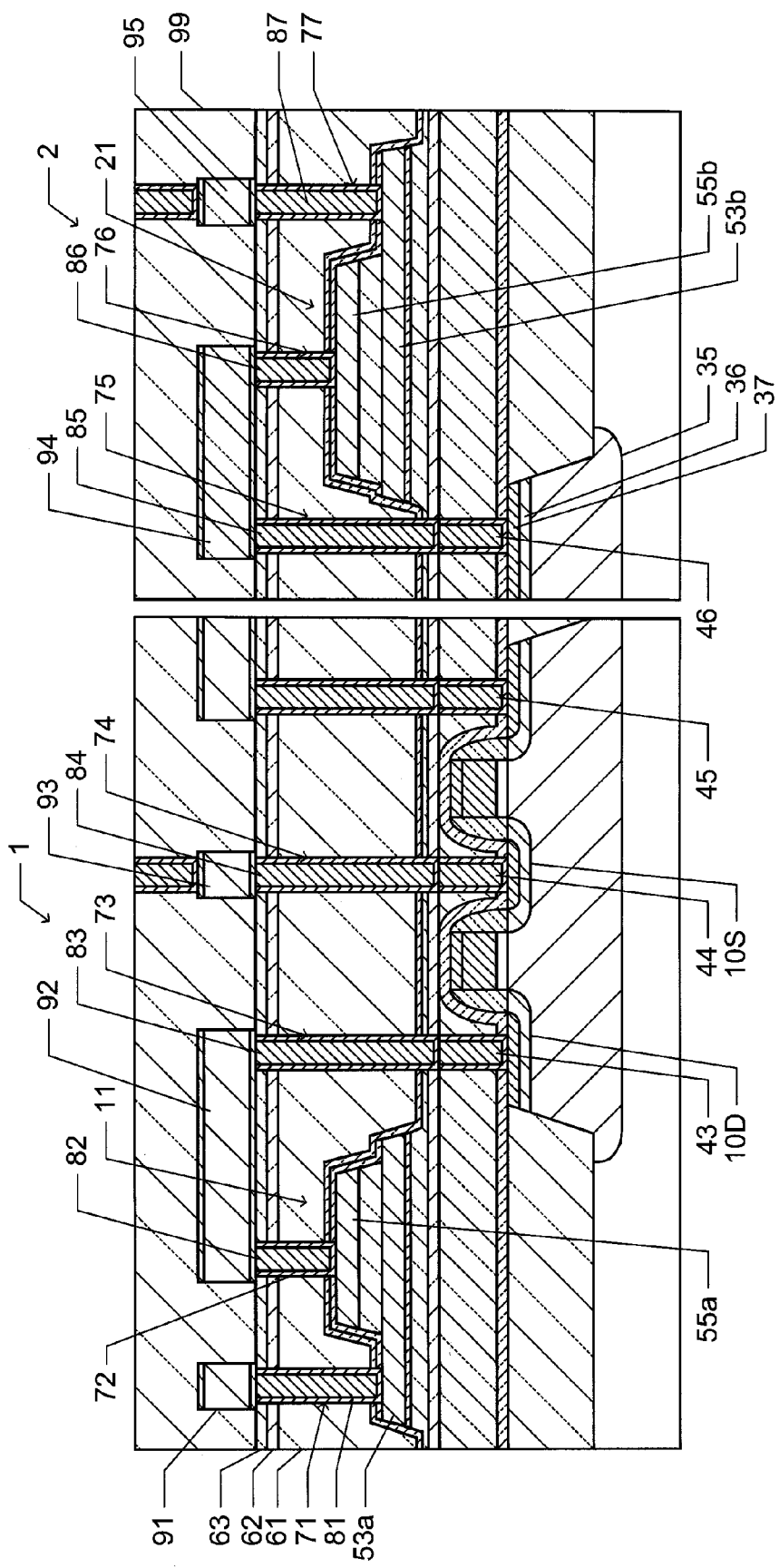

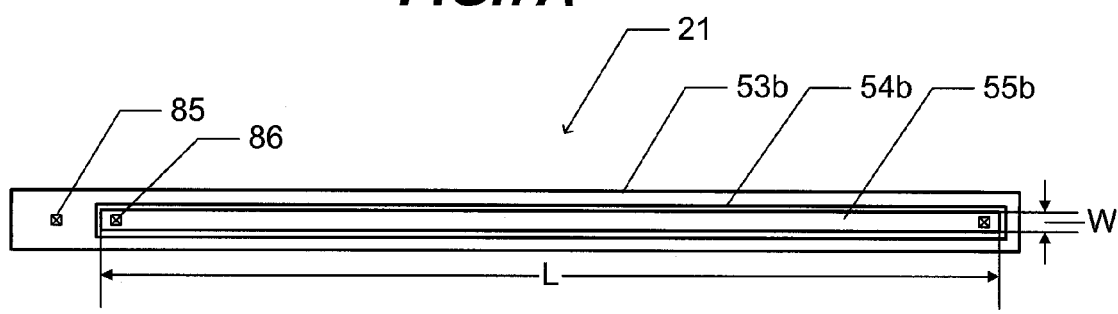
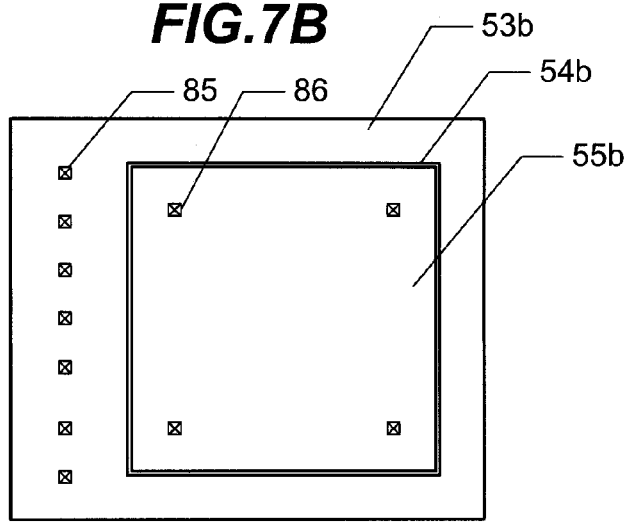

SEMICONDUCTOR DEVICE HAVING CAPACITOR WITH UPPER ELECTRODE WHOSE CIRCUMFERENCE IS MADE LONG AND ITS MANUFACTURE METHOD

CROSS-REFERENCE TO RELATED APPLICATION

This application is based upon and claims the benefit of priority of the prior International Application No. PCT/JP2006/319122, filed on Sep. 27, 2006, the entire contents of which are incorporated herein by reference.

FIELD

The embodiments discussed herein are related to a semiconductor device having capacitors, and more particularly to a semiconductor device having capacitors having a structure suitable for a smoothing capacitor with a capacitor dielectric film made of ferroelectric material.

BACKGROUND

In a prior ferroelectric memory (FRAM), a ferroelectric capacitor is used as a smoothing capacitor for a power supply circuit of a semiconductor device. Since the smoothing capacitor is formed at the same time when a capacitor (cell capacitor) of each memory cell in the ferroelectric memory device is formed, it is not necessary to add a new process of forming the smoothing capacitor. Further, since ferroelectric material is used for the capacitor dielectric film, an electrostatic capacitance can be made larger than using general insulating material.

SUMMARY

A smoothing capacitor is required to have a larger capacitance than a cell capacitor. An area occupied by the smoothing capacitor is therefore larger than an area occupied by the cell capacitor. It has been found from evaluation experiments made by the present inventors that there is a tendency that as an area of a capacitor becomes large, time dependent dielectric breakdown (TDDB) becomes short. Therefore, even if a cell capacitor has sufficient TDDB, a product lifetime is limited by TDDB of a smoothing capacitor.

According to an aspect of the invention, a semiconductor device includes:
a semiconductor substrate; and
a capacitor formed on the semiconductor substrate, constituted of a lamination sequentially stacking a lower electrode, a capacitor dielectric film and an upper electrode in an order recited, and having an area S not smaller than 1000 $\mu m^2$ and L/S not smaller than 0.4 $\mu m^{-1}$, where the area S is a capacitor region area where the lower and upper electrodes face each other with intervention of the dielectric film, and L is a total length of a circumference line of the capacitor region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a cross sectional view of the semiconductor device of the first embodiment.

FIG. 7A is a plan view of a smoothing capacitor of the semiconductor device of the first embodiment, and FIG. 7B is a plan view of a conventional smoothing capacitor.

DESCRIPTION OF EMBODIMENTS

Figure 1:
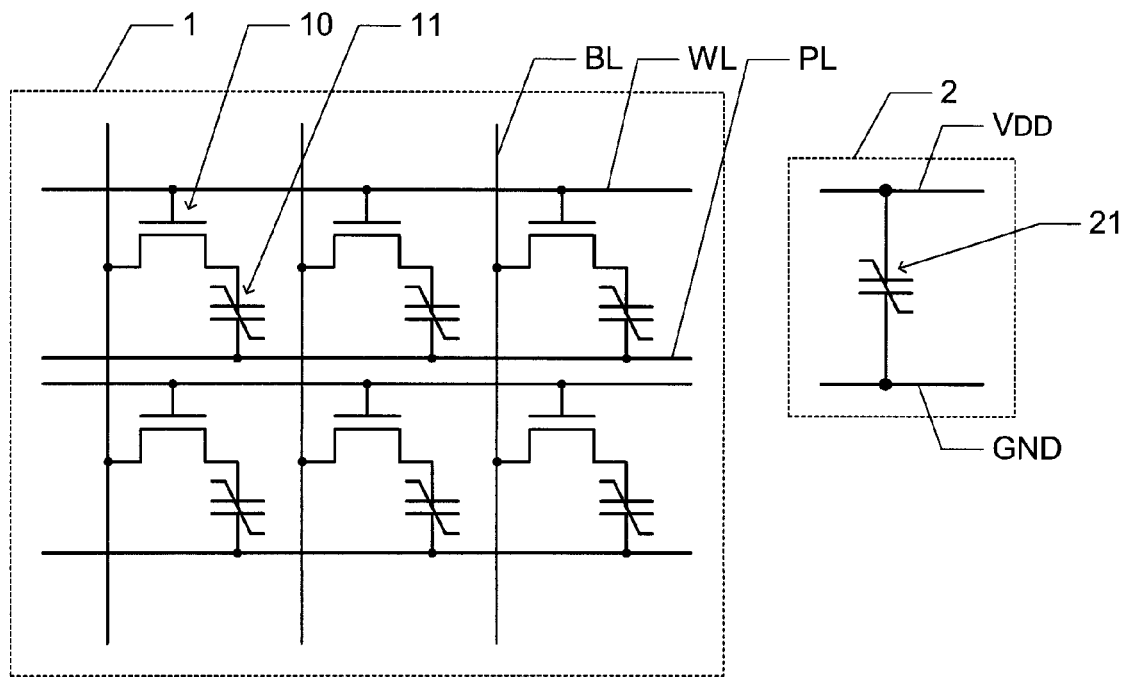
FIG. 1 is an equivalent circuit schematic of a semiconductor device according to a first embodiment.

FIG. 1 represents an equivalent circuit schematic of a semiconductor device of the first embodiment. The semiconductor device of the embodiment includes a memory cell unit 1 and a power circuit unit 2.

In the memory cell unit 1, a memory cell is disposed at each of cross points between a plurality of word lines WL extending in a lateral direction in FIG. 1 and a plurality of bit lines BL extending in a longitudinal direction. Each memory cell is constituted of a MOS transistor (switching element) 10 and a ferroelectric capacitor 11. A plate line PL is disposed in correspondence with each word line WL.

The gate electrode of each MOS transistor 1 is connected to the word line WL, the source is connected to the bit line BL, and the drain is connected to one electrode of the ferroelectric capacitor 11. The other electrode of the ferroelectric capacitor 11 is connected to a corresponding plate line PL. As the MOS transistor 10 transits to conductive state by applying an electric signal to the word line WL, a voltage corresponding to a potential difference between the bit line BL and the plate line PL is applied across the ferroelectric capacitor 11 to execute writing of data. As the MOS transistor 10 transits to conductive state, an electric signal is output to the bit line BL, in correspondence with the polarity of spontaneous polarization of the ferroelectric capacitor 11, to execute reading of data.

The power circuit unit 2 includes a power supply voltage line $V_{DD}$, a ground line GND and a smoothing capacitor 21. A capacitor dielectric film of the smoothing capacitor 21 is made of the same ferroelectric material as that of the capacitor dielectric film of the capacitor 11 (hereinafter called a "cell capacitor") of the memory cell unit.

Next, with reference to FIGS. 2 to 6, description will be made on a manufacture method for the semiconductor device of the first embodiment. The left side in FIGS. 2 to 6 indicates a cross sectional view of the memory cell unit 1, and the right side indicates a cross sectional view of the power circuit unit 2.

Figure 2:
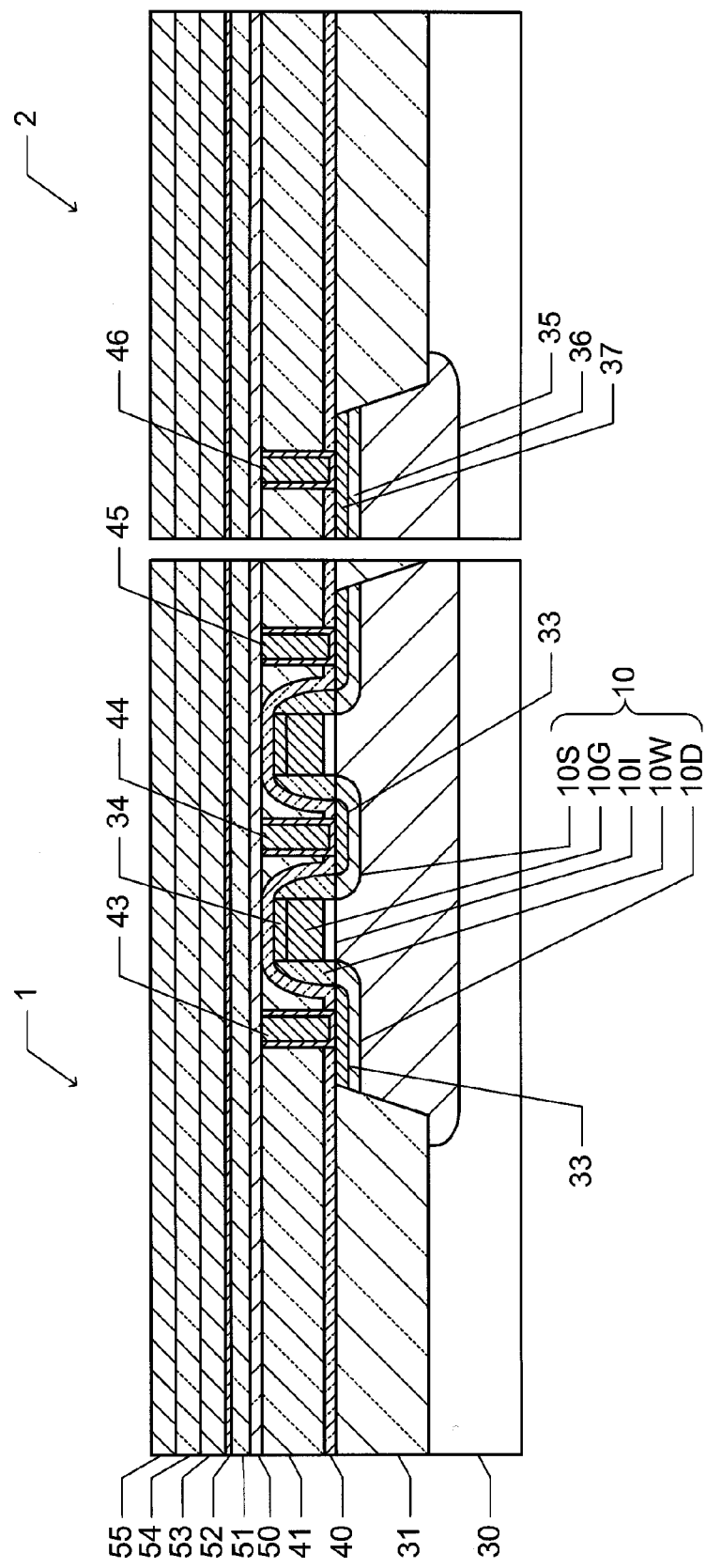
FIGS. 2 to 5 are cross sectional views of the semiconductor device during manufacture of the first embodiment.

As illustrated in FIG. 2, predetermined wells are formed in a surface layer of a semiconductor substrate 30 made of silicon. Active regions are defined by forming an element isolation insulating film 31 by shallow trench isolation (STI) or the like. A MOS transistor 10 is formed in an active region of the memory cell unit 1. The MOS transistor 10 includes a gate insulating film 10I, a gate electrode 10G, source and drain diffusion layers 10S and 10D, and side wall spacers 10W. A metal silicide film 33 of cobalt silicide ($CoSi_2$) or the like is formed on the surfaces of the source and drain diffusion layers 10S and 10D. A cap film 34 of cobalt silicide or the like is formed on the upper surface of the gate electrode 10G. The MOS transistor 10 can be formed by utilizing well known techniques such as film formation, photolithography, ion implantation, etching and silicidation.

Another MOS transistor is arranged in the active region where the MOS transistor 10 is disposed. Two MOS transistors share one source diffusion layer 10S.

In the power circuit unit 2, a p-type well 35 is formed in an active region, and a p-type well contact diffusion layer 36 is formed in the surface layer of the p-type well 35. A metal silicide film 37 of cobalt silicide or the like is formed on the surface of the well contact diffusion layer 36. The well contact diffusion layer 36 is formed at the same time when the source and drain diffusion layers of pMOS transistors on the same substrate are formed. The metal silicide film 37 is formed at the same time when the metal silicide film 33 that is disposed on the surfaces of the source and drain diffusion layers of the MOS transistor is formed.

A silicon oxynitride film 40 is formed on the substrate by CVD so as to cover the MOS transistor 10. An interlayer insulating film 41 of silicon oxide is formed on the silicon oxynitride film 40 by CVD. The silicon oxynitride film 40 prevents moisture from entering the gate insulating film 10I and the like, during a process of forming the interlayer insulating film 41. The surface of the interlayer insulating film 41 is planarized by chemical mechanical polishing (CMP). At this time, the silicon oxynitride film 40 above the gate electrode 10G serves as a stopper of polishing.

A plurality of via holes are formed extending through the interlayer insulating film 41 and silicon oxynitride film 40. The inner surfaces of these via holes are covered with a barrier metal film of TiN or the like, and the via holes are filled with plugs 43 to 46 of tungsten (W) or the like. The barrier metal films and plugs 43 to 46 can be formed by well known techniques including TiN film formation, W film formation and CMP. The plugs 43 and 44 are connected to the drain diffusion layer 10D and source diffusion layer 10S of the MOS transistor 10, respectively. The plug 45 is connected to the drain diffusion layer of the other MOS transistor. The plug 46 is connected to the well contact diffusion layer 36 on the active region of the power circuit unit 2.

The MOS transistor 10 corresponds to one memory cell, and the other MOS transistor in the same active region corresponds to another memory cell. In the following, description will be made by paying attention to the memory cell corresponding to the MOS transistor 10, and description for the memory cell corresponding to the other MOS transistor is omitted.

A silicon oxynitride film 50 having a thickness of 130 nm is formed on the interlayer insulating film 41 by CVD. A silicon oxide film 51 having a thickness of 130 nm is formed on the silicon oxynitride film 50 by CVD using $O_2$ and TEOS. An alumina (aluminum oxide) film 52 having a thickness of 20 nm is formed on the silicon oxide film 51. The alumina film 52 can be formed by sputtering, metal organic chemical vapor deposition (MOCVD) or the like. The alumina film 52 may be formed by utilizing hydrolysis represented by the following chemical formula:

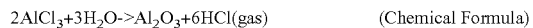

$2AlCl_3 + 3H_2O \rightarrow Al_2O_3 + 6HCl(gas)$   (Chemical Formula)

A platinum (Pt) film 53 having a thickness of 150 nm is formed on the alumina film 52 by sputtering. On the Pt film 53, a ferroelectric film 54 is formed which has a thickness of 150 nm and is made of $Pb(Zr,Ti)O_3$ (PZT). The ferroelectric film 54 can be formed by MOCVD, sputtering or the like. Instead of PZT, the ferroelectric film 54 may be made of oxide ferroelectric material such as $(Pb,La)(Zr,Ti)O_3$ (PLZT) and $SrBi_2Ta_2O_9$ (SBT).

An iridium oxide film 55 having a thickness of 250 nm is formed on the ferroelectric film 54. In the following, description will be made on a method of forming the iridium oxide film 55. First, an iridium oxide film is deposited to a thickness of 50 nm under the following conditions:

Target: metal Ir
Sputter gas: mixture gas of oxygen and argon
Pressure: 0.8 Pa
Oxygen flow rate: 100 sccm
Argon flow rate: 100 sccm
Substrate temperature: room temperature
RF power: 1 kW Thereafter, the RF power is raised to 2 kW, and an iridium oxide film is deposited by a thickness of 200 nm. In this manner, an oxygen concentration in an upper portion of the iridium oxide film 55 can be set lower than that in a lower portion.

A predetermined surface area of the iridium oxide film 55 is covered with a resist pattern, and the iridium oxide film 55 and ferroelectric film 54 are dry-etched.

Figure 3:
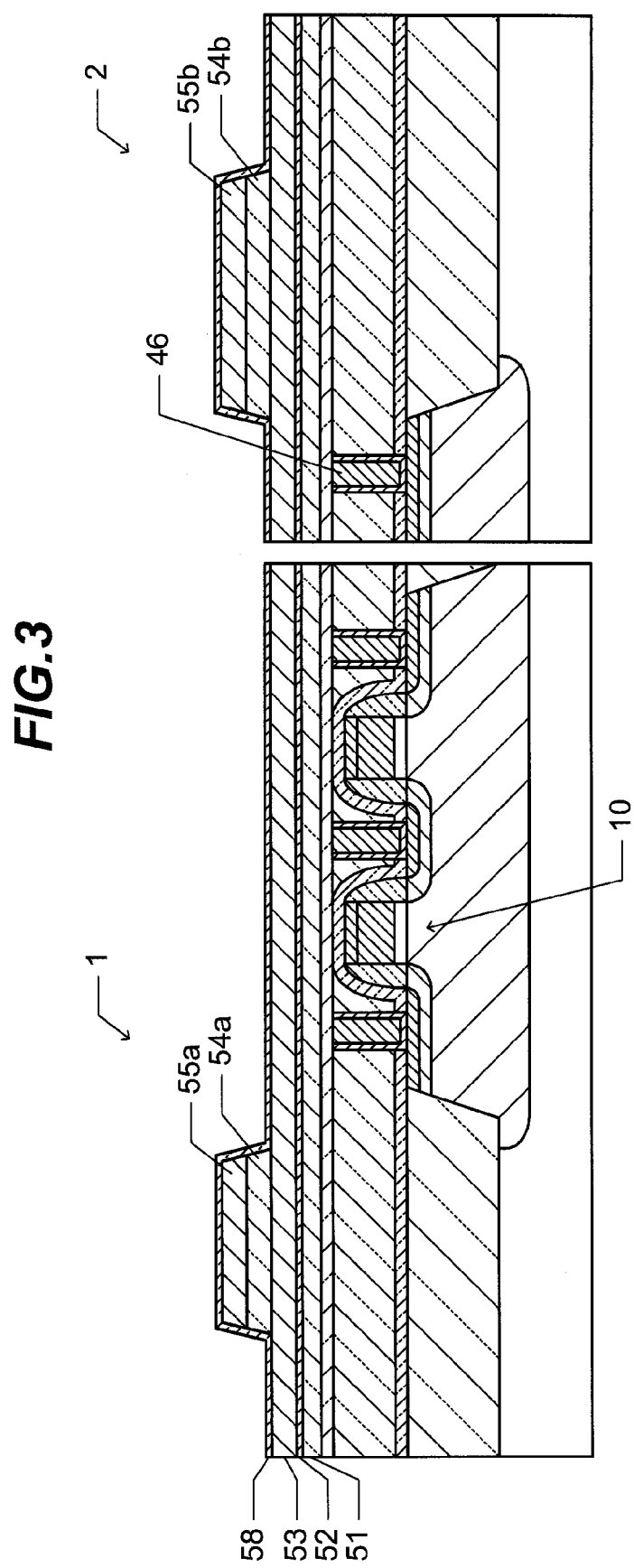

As illustrated in FIG. 3, an upper electrode 55a of iridium oxide and a capacitor ferroelectric film 54a of PZT remain in the memory cell unit 1, whereas an upper electrode 55b of iridium oxide and a capacitor ferroelectric film 54b of PZT remain in the power circuit unit 2. A lamination structure of the upper electrode 55a and capacitor ferroelectric film 54a in the memory cell unit 1 is disposed in an area not superposed upon the MOS transistor 10, whereas a lamination structure of the upper electrode 55b and capacitor ferroelectric film 54b in the power circuit unit 2 is disposed in an area not superposed upon the plug 46. The plan shape of the upper electrode 55b in the power circuit unit 2 will be later described in detail with reference to FIGS. 7A to 7C and FIGS. 8A and 8B.

After the resist pattern is removed, an alumina film 58 having a thickness of 20 nm is formed so as to cover the surface of the lamination structure constituted of the capacitor ferroelectric film 54a and upper electrode 55a in the memory cell unit 1, the surface of the lamination structure constituted of the capacitor ferroelectric film 54b and upper electrode 55b in the power circuit unit 2, and the surface of the Pt film 53.

Portions of the surface of the alumina film 58 including in plan view the upper electrode 55a and the upper electrode 55b respectively are covered with resist patterns, and the alumina film 58, Pt film 53 and underlying alumina film 52 are dry-etched.

Figure 4:
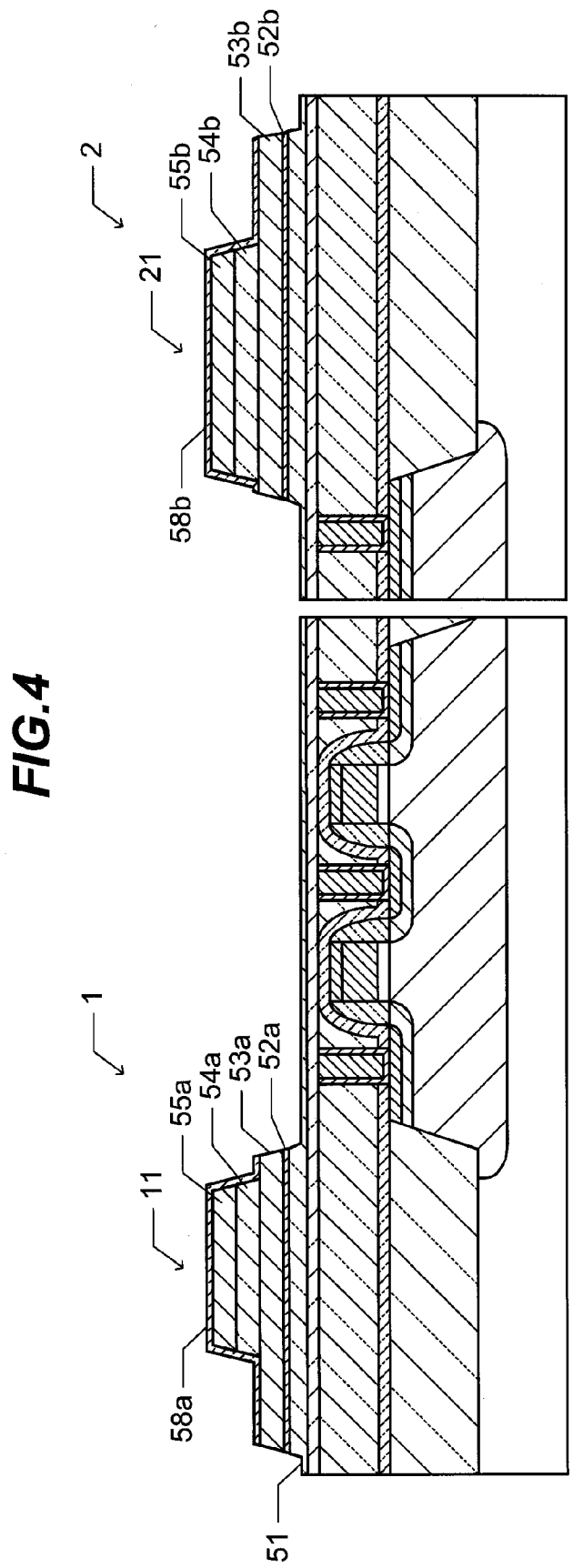

As illustrated in FIG. 4, a lower electrode 53a of Pt remains in the memory cell unit 1, and a lower electrode 53b of Pt remains in the power circuit unit 2. A cell capacitor 11 is constituted of the lower electrode 53a, capacitor ferroelectric film 54a and upper electrode 55a, and a smoothing capacitor 21 is constituted of the lower electrode 53b, capacitor ferroelectric film 54b and upper electrode 55b. In this manner, the cell capacitor 11 and smoothing capacitor 21 are formed at the same time and have the same lamination structure.

Alumina films 52a and 52b remain under the lower electrodes 53a and 53b, respectively. When the alumina film 52 is etched, an upper portion of the silicon oxide film 51 disposed under the alumina film 52 in the area not covered with the resist pattern is also etched. For example, the silicon oxide film 51 in the area not covered with the resist pattern is thinned to a thickness of 40 nm. An alumina film 58a remains on the upper surface of the lower electrode 53a, a side surface of the capacitor ferroelectric film 54a, and the surface of the upper electrode 55a, and an alumina film 58b remains on the upper surface of the lower electrode 53b, the side surface of the capacitor ferroelectric film 54b, and the surface of the upper electrode 55b.

Figure 5:
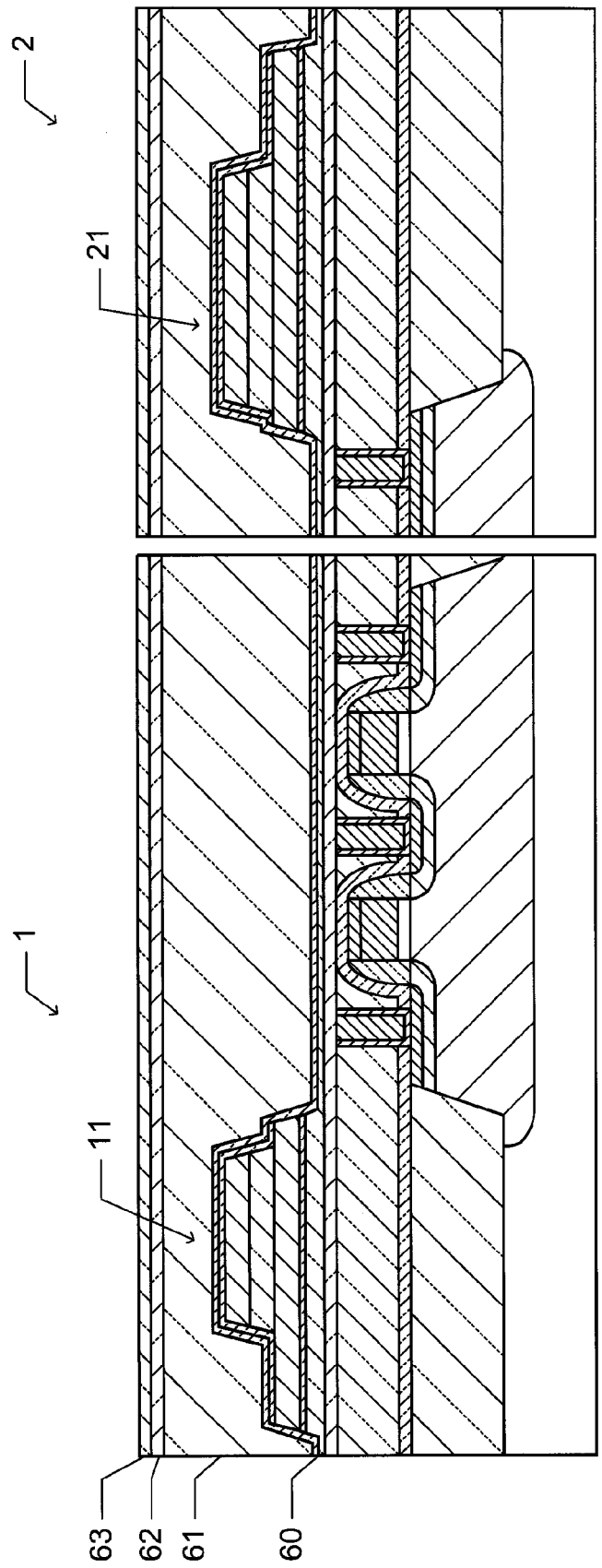

As illustrated in FIG. 5, the whole exposed surface is covered with an alumina film 60 having a thickness of 20 nm. An interlayer insulating film 61 of silicon oxide is formed on the alumina film 60 by CVD using $O_2$ and TEOS. The surface of the interlayer insulating film 61 is planarized by CMP. This planarizing process sets a thickness of the interlayer insulating film 61, for example, to 980 nm, in the area where neither the cell capacitor 11 nor smoothing capacitor 21 are disposed.

Before or after the surface of the interlayer insulating film 61 is planarized, the interlayer insulating film 61 is exposed to $N_2$ or $N_2O$ plasma. With this plasma process, moisture in the interlayer insulating film can be reduced and the film quality can be improved. A substrate temperature during the plasma process is preferably in a range between 200° C. and 450° C.

A hydrogen diffusion preventive film 62 of alumina having a thickness of 20 nm is formed on the planarized interlayer insulating film 61. An underlying film 63 of silicon oxide having a thickness of 300 nm is formed on the hydrogen diffusion preventive film 62. The underlying film 63 is formed by the same method as that of forming the interlayer insulating film 61.

As illustrated in FIG. 6, via holes 71 to 78 are formed. The via hole 71 extends from the upper surface of the underlying film 63 to the upper surface of the lower electrode 53a passing by the upper electrode 55a of the cell capacitor 11. The via hole 72 extends from the upper surface of the underlying film 63 to the upper electrode 55a of the cell capacitor 11. The via hole 73 extends from the upper surface of the underlying film 63 to the upper surface of the plug 43 on the drain diffusion layer 10D. The via hole 74 extends from the upper surface of the underlying film 63 to the upper surface of the plug 44 on the source diffusion layer 10S. The via hole 75 extends from the upper surface of the underlying film 63 to the upper surface of the plug 46 on the well contact diffusion layer 36 in the power circuit unit 2. The via hole 76 extends from the upper surface of the underlying film 63 to the upper surface of the upper electrode 55b of the smoothing capacitor 21. The via hole 77 extends from the upper surface of the underlying film 63 to the upper surface of the lower electrode 53b passing by the upper electrode 55b of the smoothing capacitor 21.

The inner surfaces of the via holes 71 to 77 are covered with a barrier metal film of TiN or the like, and the via holes 71 to 77 are filled with plugs 81 to 87 of W or the like, respectively.

Heat treatment is performed at a temperature in a range between 400° C. and 600° C. in an oxygen atmosphere, a nitrogen atmosphere or an atmosphere of mixture gas of oxygen and nitrogen. This heat treatment can recover the characteristics of the cell capacitor 11 and smoothing capacitor 21 deteriorated by the processes executed previously.

Wirings 91 to 95 of aluminum (Al), Al—Cu alloy or the like are formed on the underlying film 63. The wiring 91 is connected to the lower electrode 53a of the cell capacitor 11 via the plug 81. The plugs 82 and 83 are connected with the wiring 92. Therefore, the drain diffusion layer 10D of the MOS transistor 10 is connected to the upper electrode 55a of the cell capacitor 11. The wiring 93 is connected to the source diffusion layer 10S of the MOS transistor 10 via the plug 84. The plugs 85 and 86 are connected with the wiring 94. Therefore, the upper electrode 55b of the smoothing capacitor 21 is connected to the well contact diffusion layer 36. The wiring 95 is connected to the lower electrode 53b of the smoothing capacitor 21 via the plug 87. The underlying film 63 prevents the wirings 91 to 95 from being in direct contact with the hydrogen diffusion preventive film 62.

Depending upon a combination of wiring material and material of the hydrogen diffusion preventive film 62, both the wiring and the hydrogen diffusion preventive film 62 may affect each other. In such a case, it is preferable to dispose the underlying film 63 made of insulating material different from that of the hydrogen diffusion preventive film 62.

An interlayer insulating film 99 is formed covering the wirings 91 to 95. Predetermined via holes are formed in the interlayer insulating film 99 and filled with plugs. The wiring 93 is connected to the bit line BL illustrated in FIG. 1 via the plug, and the wiring 95 is connected to the power supply voltage line $V_{DD}$ illustrated in FIG. 1 via the plug. The bit lines BL and power supply voltage line $V_{DD}$ are disposed in a wiring layer above the interlayer insulating film 99. The wiring 91 constitutes the plate line PL illustrated in FIG. 1. The gate electrode 10G of the MOS transistor 10 extends along a direction perpendicular to the drawing sheet of FIG. 6, and serves also as the word line WL illustrated in FIG. 1. The wiring 94 constitutes the ground line GND illustrated in FIG. 1 or is connected to the ground line GND disposed in an upper layer.

FIG. 7A is a plan view of the smoothing capacitor 21 of the semiconductor device of the embodiment. The upper electrode 55b is included within the lower electrode 53b. A plan shape of the capacitor dielectric film 54b is the same as, or larger than, that of the upper electrode 55b. The plug 86 connected to the upper electrode 55b is disposed in an area inside the upper electrode 55b, whereas the plug 85 connected to the lower electrode 53b is disposed in an area inside the lower electrode 53b and outside the capacitor dielectric film 54b. A plan shape of the upper electrode 55b is a rectangle. A length of the longer side of the upper electrode 55b is represented by L, and a length (width) of the shorter side is represented by W. An area of the upper electrode 55b is, for example, 2500 $\mu m^2$.

FIG. 7B is a plan view of a conventional smoothing capacitor. A plan shape of an upper electrode 55b of a conventional smoothing capacitor 21 is approximately a square. When an area of the upper electrode 55b is to be set to 2500 $\mu m^2$, a length of each side is set to 50 $\mu m$.

Figure 8A:
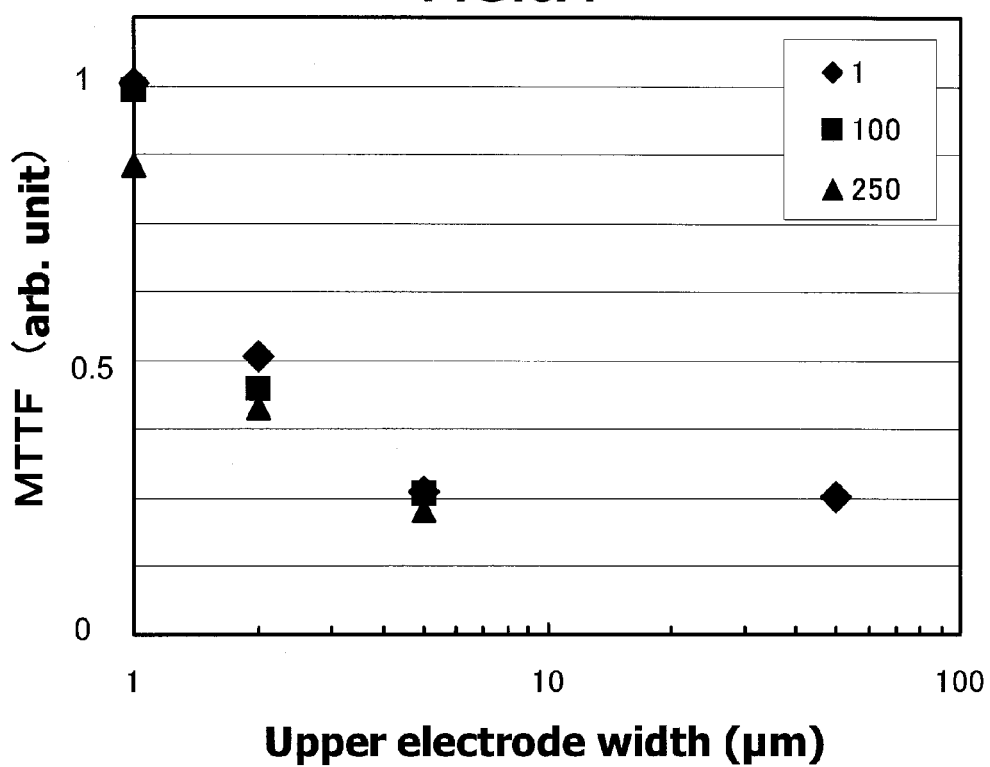
FIG. 8A is a graph representing a relation between an upper electrode width of a smoothing capacitor and MTTF.
Figure 8B:
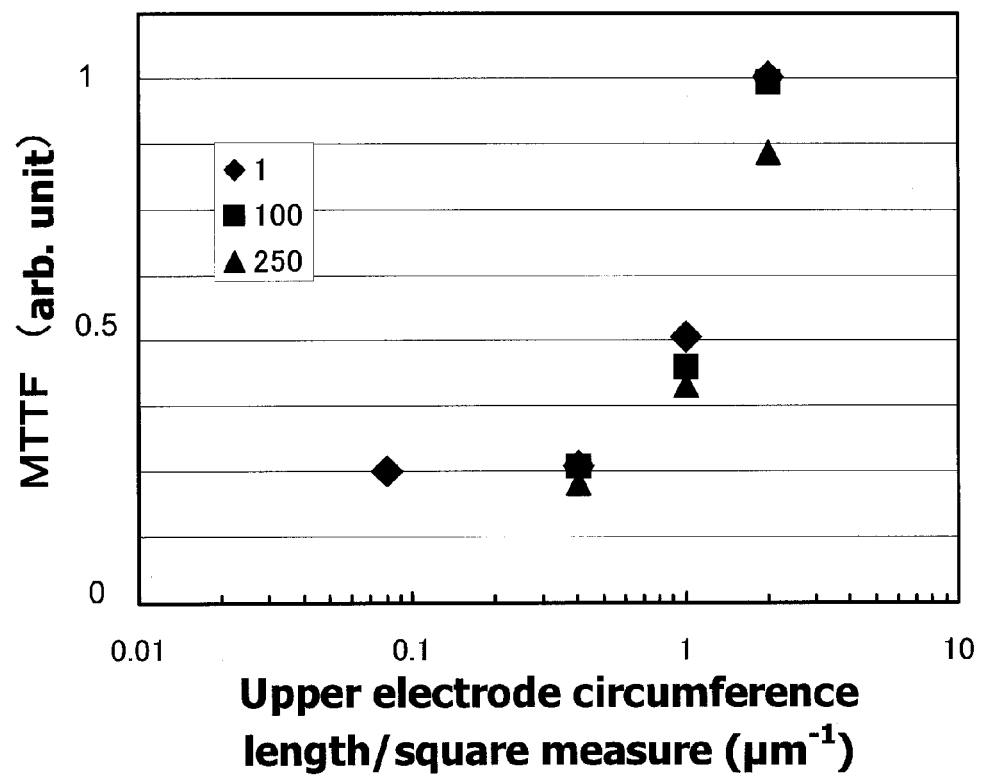
FIG. 8B is a graph representing a relation between a ratio of a circumference length to an area of the upper electrode and MTTF.

FIG. 8A illustrates a relation between a width W of the upper electrode 55b and a mean time to failure (MTTF). FIG. 8B illustrates a relation between a ratio of a circumference length to an area of the upper electrode and MTTF. The abscissa of FIG. 8A represents a width W of the upper electrode 55b in the unit of "$\mu m$". The abscissa of FIG. 8B represents a circumference length/area of the upper electrode 55b in the unit of "$\mu m^{-1}$". The ordinate of FIGS. 8A and 8B represents MTTF in an arbitrary unit setting MTTF of a sample having the longest MTTF to 1. An area of the upper electrode 55b is set to 2500 $\mu m^2$.

A rhomboid, a square and a triangle in FIGS. 8A and 8B represent samples in which the numbers of plugs 86 to be connected to the upper electrode 55b are 1, 100 and 250, respectively. The plan shape of the upper electrode 55b of the sample having a width W of 50 $\mu m$ is a square as illustrated in FIG. 7B. These samples were maintained at a temperature of 125° C., and MTTF was measured by applying a voltage of 10.5 V to the capacitor. The state that a leak current increases ten times an initial value was judged as a failure. MTTF is defined as a time to failure in 63% of all capacitors.

It can be understood that MTTF becomes long as the width W of the upper electrode 55b becomes narrow (i.e., as the circumference length is elongated), in a range where the width W is equal to or smaller than 5 μm. Particularly in a range where the width W is equal to or smaller than 2 μm, it can be understood that improvement on MTTF is remarkable. The reason why MTTF is improved will be studied in the following.

In the manufacture method of the above-described embodiment, after the plugs 81 to 87 illustrated in FIG. 6 are formed, heat treatment is performed at a temperature in a range between 400° C. and 600° C. in an oxygen atmosphere, a nitrogen atmosphere or an atmosphere of mixture gas of oxygen and nitrogen. This heat treatment can recover the characteristics of the cell capacitor 11 and smoothing capacitor 21 deteriorated by the processes executed previously. More specifically, the capacitor dielectric films 54a and 54b made of ferroelectric material can be recovered from deterioration.

During this recover annealing, the capacitor dielectric films 54a and 54b are covered with the upper electrodes 55a and 55b. It can be considered that improvement on the film quality of the capacitor dielectric films 54a and 54b by recover annealing progresses from the side edges not covered with the upper electrodes 55a and 55b. The film quality of a region covered with the upper electrodes 55a and 55b is difficult to be improved even if recover annealing is performed.

It is not easy to improve the film quality of the capacitor dielectric film 54b in the region near the center remote from the edge of the upper electrode 55b having a square shape as illustrated in FIG. 7B. In contrast, in the semiconductor device of the embodiment, the upper electrode 55b has a narrow elongated shape as illustrated in FIG. 7A. Therefore, a distance from the edge of the upper electrode 55b to the center is short as compared with the case illustrated in FIG. 7B, and it is easy to improve the film quality of almost the whole region of the capacitor dielectric film 54b. It can be considered that MTTF of the capacitor becomes long as the width W of the upper electrode 55b is narrowed.

In the above-described embodiment, although the area of the upper electrode 55b is set to 2500 μm$^2$, the effect of improving MTTF can be obtained by narrowing the width W of the upper electrode 55b even if the area is set differently. If the area of the upper electrode 55b has a size of about that of the cell capacitor, a distance from the edge of the upper electrode 55b to the center does not become long so that the plan shape is not necessarily required to be narrow and elongated. The particular effect can be obtained by thinning and elongating the upper electrode 55b in the case where a large area is required as the smoothing capacitor. This effect is high when an area S where the upper electrode 55b and lower electrode 53b face each other is equal to or larger than 1000 μm$^2$.

Further, in the above-described embodiment, although the plan shape of the upper electrode 55b is rectangle, this shape may be more generally a narrow and elongated stripe shape. In the case where the area S is equal to or larger than 1000 μm$^2$, if the plan shape of the upper electrode 55b is a shape containing a stripe portion having a width equal to or narrower than 5 μm, it becomes possible to efficiently improve the film quality of the capacitor dielectric film 54b in the stripe region.

Conversely, if the upper electrode 55b is too narrow, it becomes difficult to perform precise position alignment of the via hole for connection of the upper electrode 55b. Still further, if the upper electrode 55b is made too narrow relative to a film thickness (about 0.15 μm) of the capacitor dielectric film 54b, leak of electric flux lines becomes large. It is therefore preferable to set the width W of the upper electrode 55b equal to or wider than 1.0 μm.

Narrowing the width of the upper electrode 55b while the area S thereof is maintained constant corresponds to elongating a length LT of the circumference line. As illustrated in FIG. 8B, with the area S equal to or larger than 1000 μm$^2$, it is preferable to select a plan shape allowing LT/S to be equal to or larger than 0.4 μm$^{-1}$.

Figure 9A:
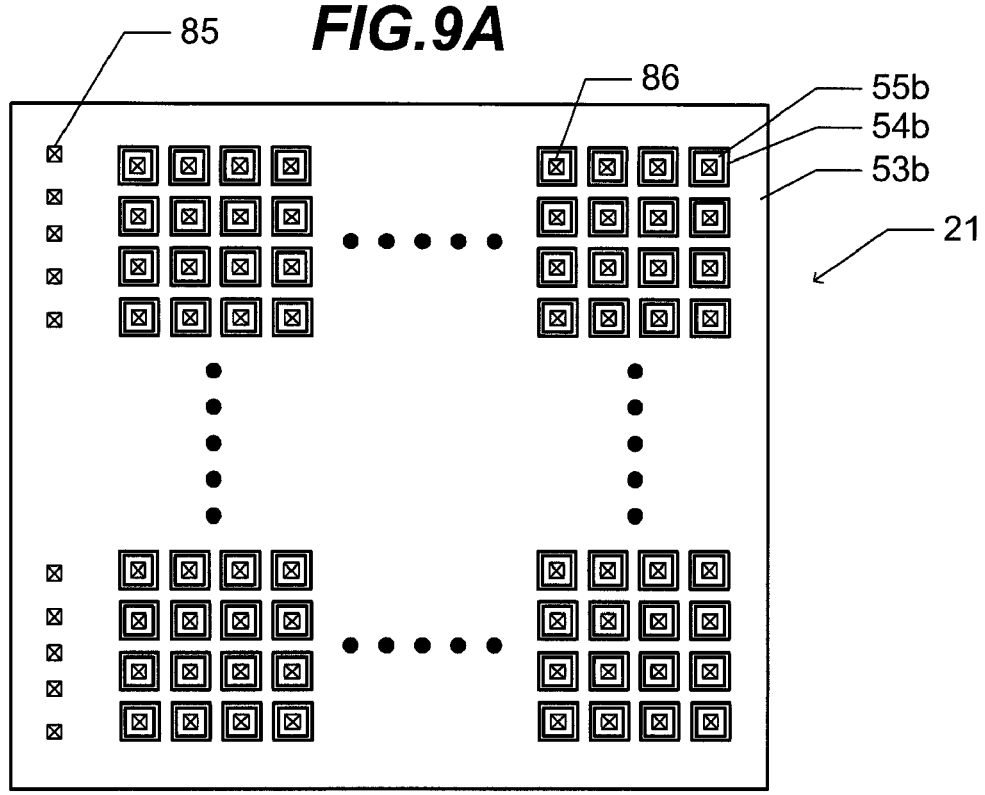
FIG. 9A is a plane view of a smoothing capacitor of a semiconductor device according to a second embodiment.

FIG. 9A illustrates a plan view of a smoothing capacitor of a semiconductor device according to the second embodiment. In the first embodiment, the upper electrode 55b has one continuous pattern, whereas in the second embodiment, each of the upper electrode 55b and capacitor dielectric film 54b has a plurality of isolated patterns. As the upper electrode 55b is constituted of a plurality of patterns, each pattern becomes smaller than the upper electrode constituted of one squared pattern. Therefore, a distance from the edge of each pattern to the center becomes short. As in the case of the first embodiment, MTTF of the capacitor can be prolonged. For example, if the upper electrode 55b is constituted of 1428 rectangular patterns of 1.15 μm×1.8 μm, an area of the upper electrode 55b is 2955.96 μm$^2$. MTTF of this capacitor was about four times that of a capacitor having the upper electrode 55b of a square pattern with one side length of 50 μm.

Figure 9B:
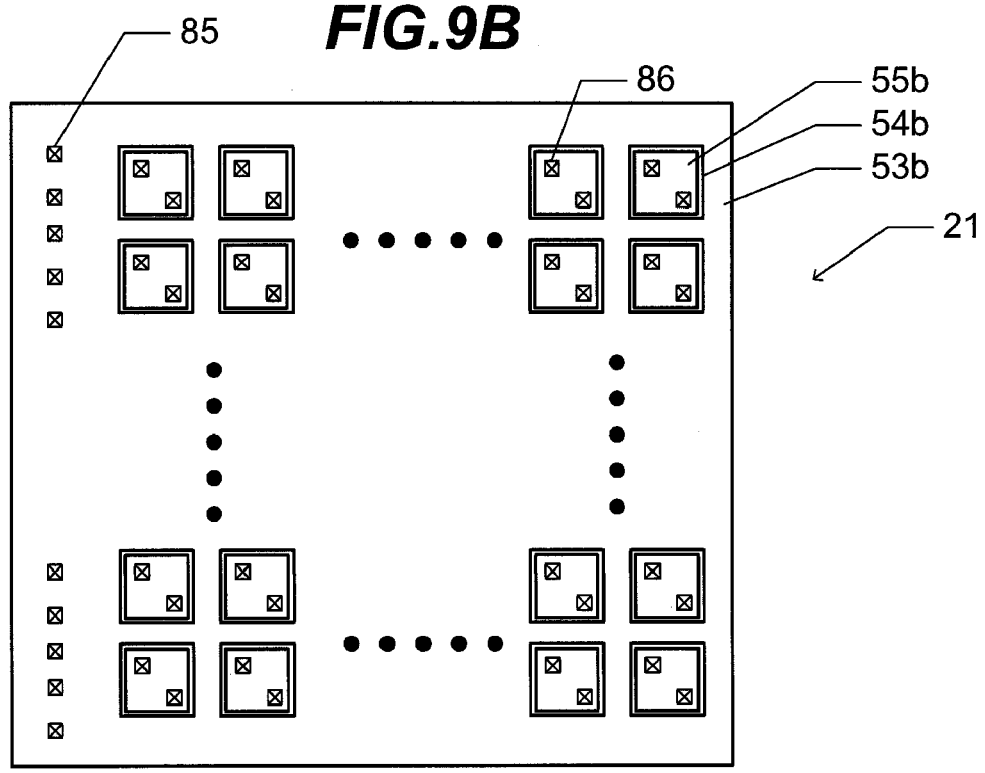
FIG. 9B is a plan view of a smoothing capacitor of a semiconductor device according to a modification of the second embodiment.

In the second embodiment, it is necessary to dispose a via hole in each of a plurality of patterns constituting the upper electrode 55b. FIG. 9A illustrates one via hole disposed in one pattern. Two via holes may be disposed in one pattern as illustrated in FIG. 9B, or three or more via holes may be disposed.

In the second embodiment, in order to improve the film quality of the capacitor dielectric film 54b, it is preferable that each pattern constituting the upper electrode 55b has a shape included within a square having one side length of 5 μm.

Further, each pattern constituting the upper electrode 55b may have a stripe plan shape like the upper electrode 55b illustrated in FIG. 7A.

Figure 10:
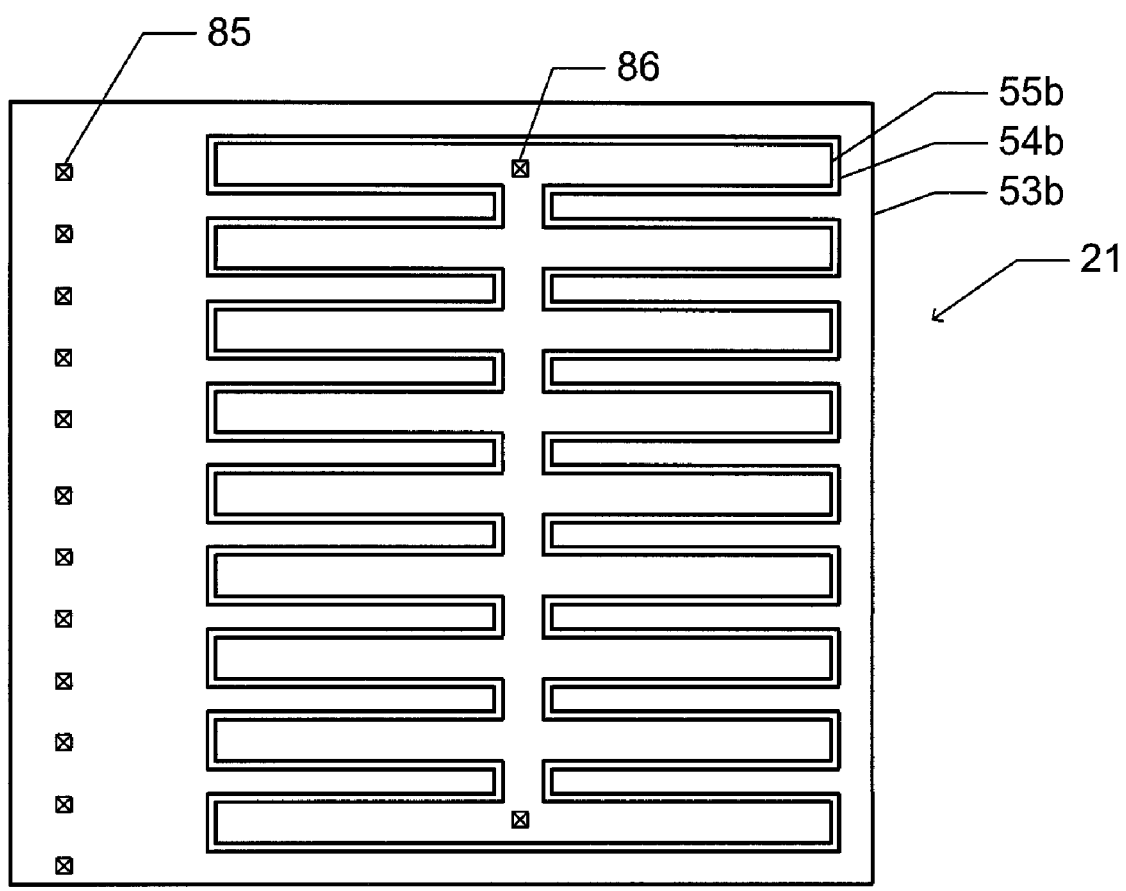
FIG. 10 is a plan view of a smoothing capacitor of a semiconductor device according to a third embodiment.

FIG. 10 is a plan view of a smoothing capacitor of a semiconductor device according to the third embodiment. In the first embodiment, the upper electrode 55b is constituted of a single stripe portion, whereas in the third embodiment, a plurality of stripe portions are coupled. Also in the third embodiment, the width of each stripe portion is set equal to or narrower than 5 μm, and the effect of prolonging MTTF can be obtained as in the case of the first embodiment.

Next, with reference to FIG. 11, description will be made on a semiconductor device according to the fourth embodiment.

Figure 11:
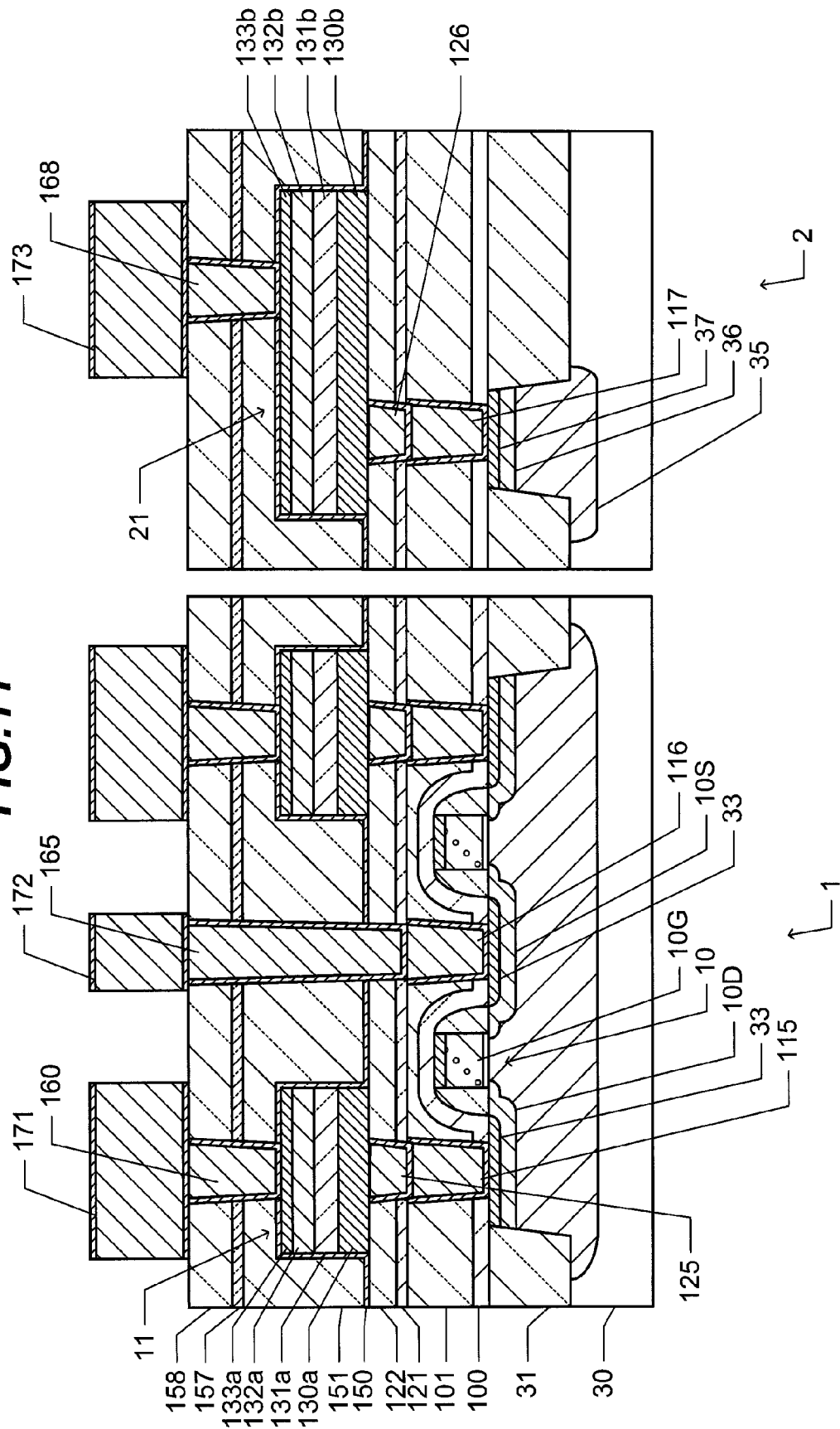
FIG. 11 is a cross sectional view of a semiconductor device according to a fourth embodiment.

FIG. 11 is a cross sectional view of a memory cell unit 1 and a power circuit unit 2. The same structure as that of the semiconductor device of the first embodiment illustrated in FIG. 1 is applied to a semiconductor substrate 30, an element isolation insulating film 31, a MOS transistor 10, a p-type well 35, a well contact diffusion layer 36 and metal silicide films 33 and 37.

A cover insulating film 100 of silicon oxynitride (SiON) having a thickness of 200 nm is formed on the semiconductor substrate 30, covering the MOS transistor 10. An interlayer insulating film 101 of silicon oxide (SiO$_2$) is formed on the cover insulating film. The surface of the interlayer insulating film 101 is planarized, and a thickness thereof is 700 nm in the flat area of the underlying surface.

Via holes are formed through the interlayer insulating film 101 and cover insulating film 100, respectively reaching a metal silicide film 33 on the drain region 10D of the MOS transistor 10, a metal silicide film 33 on the source region 10S, and a metal silicide film 37 on the well contact diffusion layer

36. A diameter of the via hole is 0.25 μm. A tight adhesion film covers the inner surface of each via hole, and the via holes are filled with conductive plugs 115, 116 and 117 of tungsten (W), respectively. The conductive plug 115 is connected to the drain region 10D, the conductive plug 116 is connected to the source region 10S, and the conductive plug 117 is connected to the well contact diffusion layer 36. The tight adhesion film in the via hole has a two-layer structure having a Ti film of 30 nm in thickness and a TiN film of 20 nm in thickness stacked in this order.

An oxidation preventive film 121 of SiON having a thickness of 130 nm is formed on the interlayer insulating film 101. An interlayer insulating film 122 of $SiO_2$ having a thickness of 300 nm is formed on the interlayer insulating film 101. Instead of SiON, the oxidation preventive film 121 may be made of silicon nitride (SiN) or alumina (AlO).

Via holes are formed extending through the interlayer insulating film 122 and oxidation preventive film 121 and reaching the upper surfaces of the conductive plugs 115 and 117 in the lower layer, respectively. A diameter of each of the via hole is 0.25 μm. A tight adhesion film covers the inner surface of each via hole, and the via holes are filled with conductive plugs 125 and 126 of W, respectively. The tight adhesion film has a two-layer structure having a Ti film of 30 nm in thickness and a TiN film of 20 nm in thickness stacked in this order. The conductive plug 125 is connected to the drain region 10D via the underlying conductive plug 115. The other conductive plug 126 is connected to the well contact diffusion layer 36 via the underlying conductive plug 117.

On the conductive plugs 125 and 126 and interlayer insulating film 122, a cell capacitor 11 is disposed so as to include the conductive plug 125 as viewed in plan and a smoothing capacitor 21 is disposed so as to include the conductive plug 126 as viewed in plan. The cell capacitor 11 has a structure that a lower electrode 130a, a dielectric film 131a, and an upper electrode 132a are laminated in this order. The lower electrode 130a is constituted of five layers of an underlying conductive film, a crystallinity improving film, an oxygen barrier film, an intermediate film and an upper conductive film, stacked in this order from the substrate side.

The underlying conductive film is made of TiN having an (111) orientation, and a thickness thereof is 100 nm. The underlying conductive film has a function to absorb a step between the upper surface of the conductive plug 125 and the upper surface of the interlayer insulating film 122 to planarize the surface.

The crystallinity improving film is made of TiN having an (111) orientation, and a thickness thereof is 20 nm. In stead of TiN, the crystallinity improving film may be made of Ti, Pt, Ir, Re, Ru, Pd, or Os or alloy of these metals. If conductive material of the crystallinity improving film has a face-centered cubic structure, the material is (111)-oriented. If the material has a hexagonal closest packed structure, the material is (002)-oriented.

The oxygen barrier film is made of TiAlN, has a thickness of 100 nm, and prevents oxygen diffusion and oxidation of the underlying conductive plug 125. The oxygen barrier film is (111)-oriented inheriting orientation of the underlying crystallinity improving film.

The upper conductive film is made of Ir and has a thickness of 100 nm. The upper conductive film is (111)-oriented because of inheritance of orientation of the oxygen barrier film. Instead of Ir, the upper conductive film may be made of metal of platinum group such as Pt or conductive oxide such as PtO, IrO, and $SrRuO_3$.

The intermediate layer is made of alloy including at least one constituent element of the oxygen barrier film and at least one constituent element of the upper conductive film. If the upper conductive film is made of Ir or IrO, the intermediate film is made of IrAl alloy.

The dielectric film 131a is made of ferroelectric material having a perovskite structure or a bismuth laminar structure, and has a thickness in a range between 100 nm and 130 nm. Usable ferroelectric material includes lead zirconate titanate (PZT), La-doped PZT (PLZT), PZT based material slightly doped with Ca, Sr or Si, $SrBi_2Ta_2O_9$ (SBT, Y1), $SrBi_2(Ta,Nb)_2O_9$ (SBTN, YZ), $(Bi,La)_4Ti_3O_{12}$ (BLT) or the like.

The upper electrode 132a is made of SrO. More particularly, the upper electrode 132a is constituted of a lower layer portion and an upper layer portion. A relative proportion of oxygen of the lower layer portion is equal to or larger than 1 and smaller than 2. A relative proportion of oxygen of the upper layer portion is larger than that of the lower layer portion and close to 2 that is the stoichiometric composition ratio. A thickness of the lower layer portion is 50 nm, and a thickness of the upper layer portion is in a range between 100 nm and 300 nm.

A hydrogen barrier film 133a is disposed on the upper electrode 132a. The hydrogen barrier film 133a is made of Ir and has a thickness of 100 nm. Instead of Ir, the hydrogen barrier film 133a may be made of Pt, $SrRuO_3$ or the like.

The smoothing capacitor 21 is constituted of a lower electrode 130b, a dielectric film 131b and an upper electrode 132b. The lamination structure of the smoothing capacitor 21 is the same as that of the cell capacitor 11. A hydrogen barrier film 133b is formed on the upper electrode 132b.

A protective film 150 is formed on the interlayer insulating film 122, covering the cell capacitor 11 and smoothing capacitor 21. The protective film 150 is made of AlO and has a thickness of about 20 nm.

An interlayer insulating film 151 of $SiO_2$ is formed on the protective film 150. The upper surface of the interlayer insulating film 151 is planarized. A barrier film 157 of AlO is formed on the planarized interlayer insulating film 151. A thickness of the barrier film 157 is in a range between 20 nm and 100 nm.

An interlayer insulating film 158 of $SiO_2$ having a thickness in a range between 800 nm and 1000 nm is formed on the barrier film 157. Instead of $SiO_2$, the interlayer insulating film 158 may be made of SiON or SiN.

A via hole is formed extending through the lamination structure between the protective film 150 and the interlayer insulating film 158 and reaching the hydrogen barrier film 133a on the cell capacitor 11. A tight adhesion film covers the inner surface of the via hole, and the via hole is filled with a conductive plug 160 of W. Another via hole is formed extending through the lamination structure between the oxidation preventive film 121 and the interlayer insulating film 158 and reaching the conductive plug 116. A tight adhesion film covers the inner surface of the via hole, and the via hole is filled with a conductive plug 165 of W. These tight adhesion films may be constituted of a single layer of TiN or two layers of a Ti film and a TiN film.

In the power circuit unit 2, a via hole is formed extending through the lamination structure between the protective film 150 and the interlayer insulating film 158 and reaching the hydrogen barrier film 133b on the smoothing capacitor 21. A tight adhesion film covers the inner surface of the via hole, and the via hole is filled with a conductive plug 168 of W.

Wirings 171 to 173 are formed on the interlayer insulating film 158. The wirings 171 to 173 each have a five-layer structure including a Ti film having a thickness of 60 nm, a TiN film having a thickness of 30 nm, an AlCu alloy film having a thickness of 360 nm, a Ti film having a thickness of 5 nm, and a TiN film having a thickness of 70 nm stacked in this order.

The wiring 171 is connected via the underlying conductive plug 160 to the upper electrode 132a of the cell capacitor 11, and corresponds to the plate line PL illustrated in FIG. 1. The wiring 172 is connected via the underlying conductive plugs 165 and 116 to the source region 10S of the MOS transistor 10, and corresponds to the bit line BL illustrated in FIG. 1. The gate electrode 10G serves also as the word line WL.

The wiring 173 is connected via the underlying conductive plug 168 to the upper electrode 132b of the smoothing capacitor 21. The wiring 173 corresponds to the power supply voltage line $V_{DD}$ illustrated in FIG. 1. The lower electrode 130b of the smoothing capacitor 21 is connected via the underlying conductive plugs 126 and 117 to the well contact diffusion layer 36. The well contact diffusion layer 36 and p-type well 35 are connected to the ground line GND illustrated in FIG. 1.

The smoothing capacitor 21 has the same plan shape as that of the upper electrode 55b of the smoothing capacitor 21 of the semiconductor device of the first embodiment illustrated in FIG. 7A. Alternatively, the smoothing capacitor 21 may have the same plan shape as that of the upper electrode 55b of the smoothing capacitor 21 of the semiconductor of the third embodiment illustrated in FIG. 10. In the fourth embodiment, a lamination structure between the upper electrode and lower electrode of the smoothing capacitor 21 is etched by using the same etching mask. Therefore, the smoothing capacitor 21 cannot be constituted of a plurality of isolated patterns illustrated in FIGS. 9A and 9B.

As in the case of the first embodiment, MTTF of the smoothing capacitor 21 can be prolonged also in respect to the semiconductor device having the structure that the cell capacitor 11 and smoothing capacitor 21 are stacked on the conductive plugs like the fourth embodiment.

In the embodiments, the plan shape of the upper electrode of the smoothing capacitor has been described. The effect of adopting the above-described plan shape is not limited only to the smoothing capacitor, but is applicable to capacitors in other application fields. By applying the plan shape to a ferroelectric capacitor, particularly to a capacitor having an area equal to or larger than 1000 µm$^2$, remarkable effects can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device comprising:
a semiconductor substrate; and
a capacitor formed over the semiconductor substrate, comprising a lower electrode, a capacitor dielectric film and an upper electrode stacked in an order recited, and having an area S equal to or larger than 1000 µm$^2$ and LT/S equal to or larger than 0.4 µm$^{-1}$, where S is an area of a capacitor region in which the lower and upper electrodes face each other across the dielectric film, and LT is a total length of a circumference line of the capacitor region.

2. The semiconductor device according to claim 1, wherein the upper electrode is included within the lower electrode as viewed in plan, and a plan shape of the upper electrode comprises a stripe portion having a width equal to or narrower than 5 µm.

3. The semiconductor device according to claim 1, wherein the upper electrode is included within the lower electrode as viewed in plan, and the upper electrode comprises a plurality of patterns isolated from each other.

4. The semiconductor device according to claim 3, wherein each of the patterns of the upper electrode has a shape included within a square having one side length of 5 µm.

5. The semiconductor device according to claim 1, further comprising
a power supply voltage line to be applied with a power supply voltage and a ground line to be applied with a ground voltage, respectively formed over the semiconductor substrate,
wherein one of the lower electrode and the upper electrode is connected to the power supply voltage line, and the other is connected to the ground line.

6. The semiconductor device according to claim 1, wherein the capacitor dielectric film comprises ferroelectric material.

7. The semiconductor device according to claim 6, further comprising:
a plurality of word lines formed over the semiconductor substrate and extending along a first direction;
a plurality of bit lines formed over the semiconductor substrate and extending along a second line crossing the word line;
a switching element disposed in correspondence with each of cross points of the word lines and the bit lines, a voltage applied to a corresponding word line controlling a conductive state between first and second terminals, and the first terminal being connected to a corresponding bit line;
an interlayer insulating film formed over the semiconductor substrate and covering the switching elements; and
a cell capacitor formed over the interlayer insulating film in correspondence with each of the cross points of the word lines and the bit lines, comprising a lower electrode, a capacitor dielectric film made of ferroelectric material and an upper electrode stacked in an order recited, one of the lower electrode and the upper electrode being connected to the second terminal of a corresponding switching element,
wherein the capacitor and the cell capacitor are disposed on the same interlayer insulating film and have a same lamination structure.

8. A semiconductor device comprising:
a semiconductor substrate; and
a capacitor formed over the semiconductor substrate, comprising a lower electrode, a capacitor dielectric film and an upper electrode stacked in an order recited,
wherein the upper electrode is included within the lower electrode as viewed in plan, and the upper electrode comprises a plurality of patterns isolated from each other, the plurality of patterns are electrically short-circuited with each other to be configured to serve as the upper electrode for the one capacitor.

9. The semiconductor device according to claim 8, wherein a plan shape of each of the patterns of the upper electrode comprises a stripe portion having a width equal to or narrower than 5 µm.

10. The semiconductor device according to claim 8, wherein each of the patterns of the upper electrode has a shape included within a square having one side length of 5 µm.

11. The semiconductor device according to claim 8, wherein the capacitor dielectric film comprises ferroelectric material.

12. The semiconductor device according to claim 11, further comprising:
a plurality of word lines formed over the semiconductor substrate and extending along a first direction;
a plurality of bit lines formed over the semiconductor substrate and extending along a second line crossing the word line;
a switching element disposed in correspondence with each of cross points of the word lines and the bit lines, a voltage applied to a corresponding word line controlling a conductive state between first and second terminals, and the first terminal being connected to a corresponding bit line;
an interlayer insulating film formed over the semiconductor substrate and covering the switching elements; and
a cell capacitor formed over the interlayer insulating film in correspondence with each of the cross points of the word lines and the bit lines, comprising a lower electrode, a capacitor dielectric film made of ferroelectric material and an upper electrode in an order recited, one of the lower electrode and the upper electrode being connected to the second terminal of the corresponding switching element,
wherein the capacitor and the cell capacitor are disposed on the same interlayer insulating film and have a same lamination structure.

13. A semiconductor device comprising:
a semiconductor substrate;
a capacitor formed over the semiconductor substrate, comprising a lower electrode, a capacitor dielectric film and an upper electrode stacked in an order recited; and
a power supply voltage line to be applied with a power supply voltage and a ground line to be applied with a ground voltage, respectively formed over the semiconductor substrate,
wherein the upper electrode is included within the lower electrode as viewed in plan, and the upper electrode comprises a plurality of patterns isolated form each other, and
wherein each of the patterns of the upper electrode is connected to one of the power supply voltage line and the ground line, and the lower electrode is connected to the other of the power supply voltage line and the ground line.

14. A manufacture method for a semiconductor device comprising:
forming over a semiconductor substrate a capacitor comprising a lower electrode, a capacitor dielectric film made of ferroelectric material and an upper electrode stacked in an order recited, and having an area S equal to or larger than 1000 µm$^2$ and LT/S equal to or larger than 0.4 µm$^{-1}$, where S is an area of a capacitor region in which the lower and upper electrodes face each other across the dielectric film, and LT is a total length of a circumference line of the capacitor region; and
heating the capacitor to improve a film quality of the capacitor dielectric film.

15. The manufacture method for a semiconductor device according to claim 14, wherein the upper electrode is included within the lower electrode as viewed in plan, and a plan shape of the upper electrode comprises a stripe portion having a width equal to or narrower than 5 µm.

16. The manufacture method for a semiconductor device according to claim 14, wherein the upper electrode is included within the lower electrode as viewed in plan, and the upper electrode comprises a plurality of patterns isolated from each other.

17. The manufacture method for a semiconductor device according to claim 16, wherein each of the patterns of the upper electrode has a shape included within a square having one side length of 5 µm.

18. The manufacture method for a semiconductor device according to claim 14, further comprising
forming a power supply voltage line to be applied with a power supply voltage and a ground line to be applied with a ground voltage, over the semiconductor substrate,
wherein one of the lower electrode and the upper electrode is connected to the power supply voltage line, and the other is connected to the ground line.

19. The manufacture method for a semiconductor device according to claim 14, further comprising:
forming switching elements comprising a first terminal and a second terminal over the semiconductor substrate;
covering the switching elements with an interlayer insulating film;
forming a cell capacitor over the interlayer insulating film in correspondence with each of the switching elements, the cell capacitor comprising a lower electrode, a capacitor dielectric film made of ferroelectric material and an upper electrode; and
connecting the first terminal of the switching element to one of the upper electrode and the lower electrode of the corresponding cell capacitor,
wherein the capacitor and the cell capacitor are disposed on the same interlayer insulating film and formed at the same time.

* * * * *